US 6,654,398 B2

(12) United States Patent
Cho et al.

(10) Patent No.: US 6,654,398 B2
(45) Date of Patent: Nov. 25, 2003

(54) SEMICONDUCTOR LASER DIODE FOR CONTROLLING WIDTH OF CARRIER INFLOW PATH

(75) Inventors: Jae-hee Cho, Seoul (KR); Joon-seop Kwak, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 10/053,736

(22) Filed: Jan. 24, 2002

(65) Prior Publication Data

US 2002/0114368 A1 Aug. 22, 2002

(30) Foreign Application Priority Data

Feb. 16, 2001 (KR) .......................................... 2001-7846

(51) Int. Cl.[7] ................................................ H01S 5/00
(52) U.S. Cl. ........................................... 372/46; 372/45
(58) Field of Search ........................ 372/46, 45; 385/8; 257/59

(56) References Cited

U.S. PATENT DOCUMENTS 6,118,800 A * 9/2000 Kidoguchi et al. ............ 372/46
6,166,397 A * 12/2000 Yamazaki et al. ............. 257/59
6,252,894 B1 * 6/2001 Sasanuma et al. ............. 372/45
6,359,292 B1 * 3/2002 Sugawara et al. ........... 257/103
6,374,001 B1 * 4/2002 Bozeat et al. ................... 385/8
6,377,597 B1 * 4/2002 Okumura ...................... 372/45

FOREIGN PATENT DOCUMENTS

| JP | 63-313887 | 12/1988 |
| JP | 06-029616 | 2/1994 |

* cited by examiner

*Primary Examiner*—Paul Ip
*Assistant Examiner*—Hung T Vy
(74) *Attorney, Agent, or Firm*—Burns, Doane, Swecker & Mathis, L.L.P.

(57) ABSTRACT

A semiconductor laser diode for controlling the width of a carrier inflow path is provided. The semiconductor laser diode includes a p-type material layer for lasing between a p-type electrode and an n-type electrode, an active layer, and an n-type material layer. The p-type electrode restrictively contacts the p-type material layer. A carrier inflow width controller is included to control the width of a path of carriers flowing from the p-type electrode into the active layer.

10 Claims, 4 Drawing Sheets

SEMICONDUCTOR LASER DIODE FOR CONTROLLING WIDTH OF CARRIER INFLOW PATH

Priority is claimed to Patent Application Number 2001-7846, filed in the Republic of Korea on Feb. 16, 2001, herein incorporated by reference.

BACKGROUND OF THE INVENTION

1. Field of the Invention

The present invention relates to a semiconductor laser diode, and more particularly, to a semiconductor laser diode which can control modes of a laser by a method of controlling the width of a carrier inflow path.

2. Description of the Related Art

Semiconductor laser diodes are widely used as devices for transmitting data at a high speed or recording and reading data at a high speed in communications or players in which optical disks are used. This is because the semiconductor laser diodes can be downsized, and have a lower threshold current for laser oscillation than general laser systems.

As semiconductor laser diodes are applied in a wide variety of areas, there is an increasing need for semiconductor laser diodes which easily control smaller modes and have low threshold current for laser oscillation. As a result, semiconductor laser diodes where threshold current is reduced have appeared or are appearing. FIG. 1 shows an example of these semiconductor laser diodes.

FIG. 1 is a cross-sectional view of a semiconductor laser diode, according to the prior art, which is a ridge-shaped semiconductor laser diode having a ridge for reducing threshold current for laser oscillation and stabilizing modes. The semiconductor laser diode according to the prior art will be briefly described with reference to the FIG. 1. An n-GaN layer 12 is formed on a sapphire substrate 10. The n-GaN layer 12 may be divided into a first region R1 and a second region R2. An n-AlGaN/GaN layer 24, an n-GaN waveguide layer 26, an active layer (InGaN layer) 28, a p-GaN waveguide layer 30, and a p-AlGaN/GaN layer 32 are sequentially formed on the first region R1. Refractive indexes of the n-AlGaN/GaN layer 24 and the p-AlGaN/GaN layer 32 are lower than refractive indexes of the n-GaN waveguide layer 26 and the p-GaN waveguide layer 30 which are lower than a refractive index of the active layer 28. The p-AlGaN/GaN layer 32 has a ridge shape where the upper center protrudes. The protruding ridge of the p-AlGaN/GaN layer 32 defines a resonant region for laser oscillation on the active layer 28 by controlling current supplied. A p-GaN layer 34 is formed on the protruding ridge of the p-AlGaN/GaN layer 32. The whole surface of the p-AlGaN/GaN layer 32 is covered with a protective layer 36. A portion of both sides of the p-GaN layer 34 except for the central portion of the p-GaN layer 34 which is a path for current contacts the protective layer 36. A p-type electrode 38, which contacts the whole surface of the p-GaN layer 34, is formed on the protective layer 36.

The second region R2 of the n-GaN layer 12 where an n-type electrode 40 is formed is lower than the first region R1.

As described above, in the semiconductor laser diode according to the prior ar, supplied current is controlled due to a ridge structure to define a resonance width. Thus, there are advantages in that optical modes of the ridge structure are improved to some extent compared to an existing non-ridge structure and threshold current for laser oscillation is reduced. However, there is a problem in that multi-mode oscillation occurs depending on the width of the ridge. This problem is solved to some extent by reducing the width of the ridge to a few micrometers using a fine (or micro-machining) process. However, this machining process is not stable and it is difficult to incorporate into a mass production scheme. As shown in FIG. 2, in the semiconductor laser diode according to the prior art, a near field pattern is seriously deformed depending on the width of the ridge. Also, a switching in a lasing state may be modulated to current over or less than the threshold current. This modulation may cause deterioration of the stability of the semiconductor laser diode and shortening of the life of the semiconductor laser diode.

SUMMARY OF THE INVENTION

To solve the above-described problems, it is an object of the present invention to provide a semiconductor laser diode which can control modes of a laser and switching of a lasing state by controlling the width of a carrier inflow path from a ridge to an active layer.

Accordingly, to achieve the object, there is provided a semiconductor laser diode having a p-type material layer, an active layer, and an n-type material layer for lasing between a p-type electrode and an n-type electrode, the semiconductor laser diode comprising a carrier inflow width controller for controlling the width of a path of carriers flowing from the p-type electrode which restrictively contact the p-type material layer into the active layer. The p-type electrode restrictively contacts the p-type material layer.

The carrier inflow width controller is a first carrier inflow width controller formed on the p-type material layer not to contact the p-type electrode.

A second carrier inflow width controller is further included between the p-type material layer and the p-type electrode. Here, the second carrier inflow width controller is a ridge in which a portion of the p-type material layer protrudes toward the p-type electrode.

The p-type electrode extends over the first carrier inflow width controller and is filled with a dielectric layer. Here, the second carrier inflow width controller is a portion of the p-type electrode which protrudes down toward the p-type material layer.

The first carrier inflow width controller is a metallic pad layer using a schottky contact characteristic according to which a reverse voltage is applied when a voltage for lasing is applied.

A dielectric layer is further included between the metallic pad layer and the p-type material layer.

As described above, the semiconductor laser diode according to the present invention includes a carrier inflow width controller to control the width of a path of carriers flowing from a ridge into an active layer. Thus, even in a case where the physical width of the ridge is wide, an effective width of the ridge can be narrowed by controlling a reverse voltage applied to the carrier inflow width controller. As a result, it is possible to control modes of a laser closely related with the effective width of the ridge. Thus, even in the case where the physical width of the ridge is wide, the effective width of the ridge is controlled easily that has an advantage of mode stability. Finally, a near field pattern near to an ideal shape is obtained. Thus, the difference between horizontal and vertical shapes of the near field pattern is reduced to reduce distortion of the near field pattern. In addition, the diffusion of carriers in a horizontal direction when carriers pass through the ridge 62a is reduced, thereby reducing threshold current required for lasing. Also, the inflow path of carriers is completely blocked by increasing the reverse voltage applied to the carrier inflow width controller. Thus, rapid on/off switching can be realized. As described, it is easy to modulate the semiconductor laser diode without changing threshold current. Thus, the stability of the semiconductor laser diode can be ensured and the life of the semiconductor laser diode can be extended. As described above, the effective width of the ridge is controlled regardless of the physical width of the ridge. Thus, a process margin for the ridge is wide in a process of manufacturing the semiconductor laser diode. Therefore, a process of manufacturing the semiconductor laser diode is simple compared to the prior art and yield can be increased.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Hereinafter, a semiconductor laser diode which can control the width of a carrier inflow path according to embodiments of the present invention will be described with reference to the attached drawings. The merits of the present invention will be apparent from the following description. In drawings, the thicknesses of layers or regions may be exaggerated for clarity.

<First embodiment>

Figure 3:
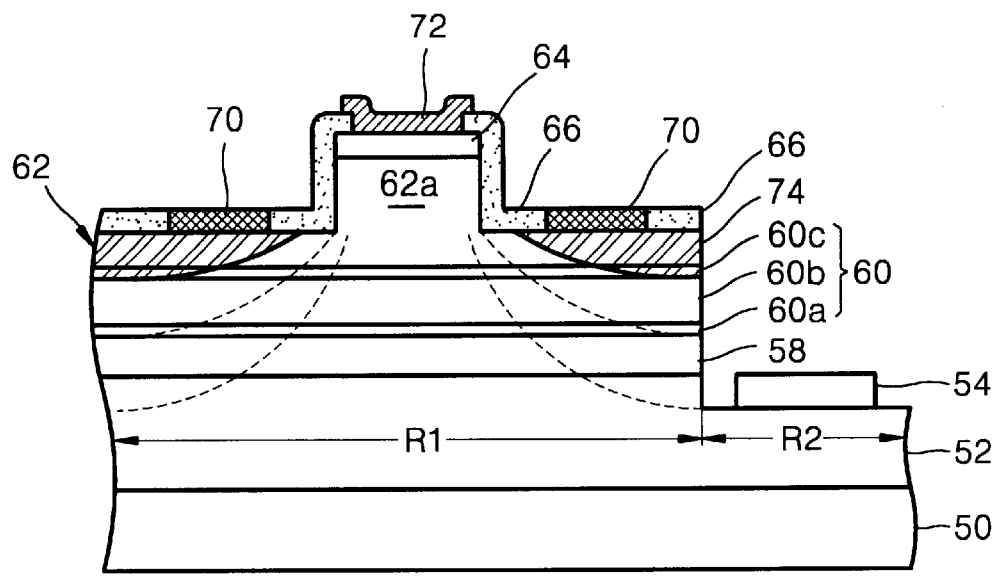
FIG. 3 is a cross-sectional view of a semiconductor laser diode which can control the width of a carrier inflow path according to a first embodiment of the present invention.

Referring to FIG. 3, a first compound semiconductor layer 52 is formed on a substrate 50. It is preferable that the substrate 50 can grow gallium nitride or gallium nitride-based substances. Thus, the substrate 50 is preferably a sapphire substrate, a compound semiconductor substrate of a III–V group (e.g., a GaN substrate), or a silicon carbon (SiC) substrate. The first compound semiconductor layer 52, which is a GaN-based III–V group nitride compound semiconductor layer, is formed of an n-type material or an undoped material. Preferably, the first compound semiconductor layer 52 is an n-GaN layer or a GaN layer. However, the first compound semiconductor layer 52 may be an AlGaN layer containing a predetermined ratio of aluminium (Al) or an InGaN layer containing a predetermined ratio of indium (In). The first compound semiconductor layer 52 is divided into first and second regions R1 and R2. The first region R1 is wider and thicker than the second region R2. Thus, a step difference occurs between the first and second regions R1 and R2. A first electrode 54 is formed on the second region R2. The first electrode 54 is an n-type electrode. A first clad layer 58 and a resonant layer 60 are sequentially formed on the first region R1. The first clad layer 58 is an n-AlGaN/GaN layer having a refractive index higher than the resonant layer 60. The resonant layer 60 includes a first waveguide layer 60a, an active layer 60b, and a second waveguide layer 60c which are sequentially formed on the first clad layer 58. The first compound semiconductor layer 52, the first clad layer 58, and the first waveguide layer 60a constitute a first material layer for lasing, used to induce laser oscillation in the active layer 60b. The active layer 60b, which is a material layer where lasing occurs due to a recombination of carriers such as electron holes, is a GaN-based compound semiconductor layer of the III–V group having a multi quantum well (MQW) structure, i.e., a nitride semiconductor layer. For example, the active layer 60b is an $In_xAl_yGa_{1-x-y}N$ ($0 \leq x \leq 1$, $0 \leq y \leq 1$, and $x+y \leq 1$) layer. The active layer 60b may be a GaN-based nitride compound semiconductor layer of the III–V group containing a predetermined amount of indium (In), e.g., an InGaN layer. The first and second waveguide layers 60a and 60c are preferably GaN-based compound semiconductor layers of the III–V group which have refractive indexes lower than the active layer 60b and higher than the first clad layer 58 and a second clad layer 62. For example, it is preferable that the first and second waveguide layers 60a and 60c are an n-GaN layer and a p-GaN layer, respectively. A second clad layer 62 and a second compound semiconductor layer 64 are sequentially formed on the resonant layer 60. The second waveguide layer 60c, the second clad layer 62, and the second compound semiconductor layer 64 constitute a second material layer for lasing, used to induce laser oscillation in the active layer 60b.

The second clad layer 62 is divided into two portions. One is an upward protruding portion having a predetermined width (hereinafter, referred to as a ridge 62a) and the other is a portion which horizontally extends from the ridge 62a to the resonant layer 60. The extended portion is thicker than the ridge 62a. The second compound semiconductor layer 64 is formed on the ridge 62a, and a second electrode 72 is formed on the second compound semiconductor layer 64. The second electrode 72 is a p-type electrode.

First carrier inflow width controllers 70 are formed on the extended portion. The first carrier inflow width controllers 70 are symmetrical to the ridge 62a. The second clad layer 62 around the first carrier inflow width controller 70 is covered with a protective layer 66. The protective layer 66 contacts the second compound semiconductor layer 64.

The first carrier inflow width controllers 70 control the width of the inflow path of carriers flowing into the active layer 60b through the ridge 62a. For example, the first carrier inflow width controllers 70 are metal pad layers using Schottky contacts. Here, the metal pad layers are formed of any one of palladium (Pd), nickel (Ni), aurum (Au), platinum (Pt), Indium Tin Oxide (ITO), and titanium (Ti).

The width of the ridge 62a limits the width of a path of carriers flowing from the second electrode 72 into the second material layer. Thus, the ridge 62a may have a second carrier inflow width controller.

Accordingly, the width of the path of carriers flowing from the second electrode 72 into the active layer 60b is firstly limited by the ridge 62a and secondarily by the first carrier inflow width controllers 70.

When a laser is oscillated, a forward voltage is applied between the first and second electrodes 54 and 72 while a reverse voltage is applied to the first carrier inflow width controllers 70. As a result, an area where current does not flow, i.e., a depletion area 74 is formed in a material formed underneath the first carrier inflow width controllers 70, e.g., the second clad layer 62, due to the lack of current.

The size of the depletion area 74 is determined by formula 1:

$$W=[2(V_{bi}+V_0)\in/qN_A]^{1/2} \quad (1)$$

where $V_{bi}$ represents a reverse voltage applied to the first carrier inflow width controllers 70, $V_0$ represents an autogenetic voltage between a metal layer and a semiconductor layer, q represents the electric charge of a carrier, $N_A$ represents the number of carriers per unit volume.

The formula (1) shows that as the reverse voltage $V_{bi}$ increases, the depletion area 74 grows. In other words, as shown with dotted lines in FIG. 3, an increase of the reverse voltage applied to the first carrier inflow width controllers 70 results in extending the depletion area 74 from the second clad layer 62 to the resonant layer 60 and a predetermined region of the first material layer underneath the resonant layer 60 downward and horizontally to a predetermined portion of the inside of the ridge 62a. As a result, an effective width of the ridge 62a limiting the path of carriers flowing in from the p-type electrode 72 is narrower than a physical width of the ridge 62a.

The boundary of the depletion area 74 may extend to a predetermined portion of the inside of the ridge 62a depending on the strength of the reverse voltage as shown in FIG. 3. Thus, carriers flowing from the ridge 62a to the active region 60b are prevented from being diffused in a horizontal direction when the carriers pass through the ridge 62a by controlling the reverse voltage applied to the first carrier inflow width controller 70. As a result, most carriers from the ridge 62a flow into the active region 60b to be used for lasing, and thus a threshold current for lasing is reduced.

Figure 1:
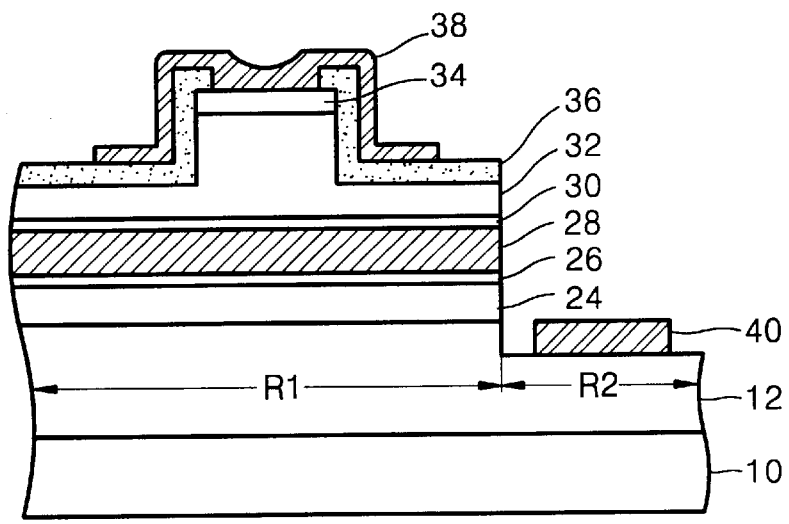
FIG. 1 is a cross-sectional view of a semiconductor laser diode according to the prior art.
Figure 2:
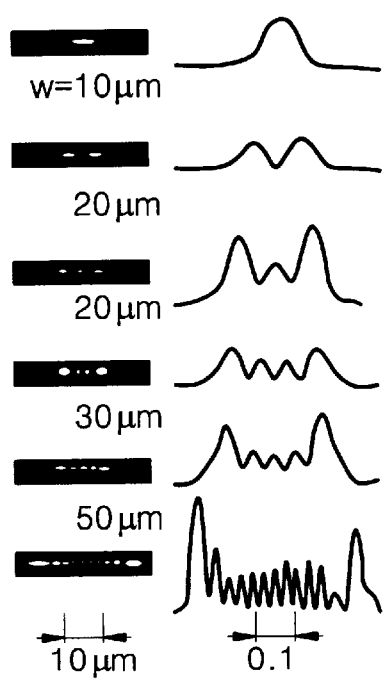
FIG. 2 shows changes in a near field pattern and a far field pattern of a laser emitted depending on the width of a ridge in the semiconductor laser diode shown in FIG. 1.

The strength of the reverse voltage applied to the first carrier inflow width controller 70 is controlled to control the effective width of the ridge 62a. Modes of a laser are related with the width of a carrier inflow path, and thus control of the modes of the laser is possible by controlling the strength of the reverse voltage applied to the first carrier inflow width controller 70. For example, the modes of the laser vary depending on the width of the ridge 62a as shown in FIG. 2. However, the effective width of the carrier inflow path may be controlled regardless of the actual width of the ridge 62a so that the reverse voltage is controlled for the oscillation of a basic laser mode. As a result, an optimum near field pattern near to an original shape of a laser can be obtained and the difference between a horizontal mode and a vertical mode of the near field pattern can be reduced, thereby considerably reducing distortion of the near field pattern. In addition, a wave field pattern can be an ideal shape since the shape of the wave field pattern is determined by the near field pattern.

The depletion area 74 extends to the second clad layer 62 to completely block carriers flowing from the second electrode 72 into the active region 60b. Thus, the laser can be switched on/off by controlling only the reverse voltage applied to the first carrier inflow width controller 70 regardless of threshold current. Thus, the laser is easily modulated compared to the prior art.

The effective width of the ridge 62a can be controlled by controlling the reverse voltage applied to the first carrier inflow width controller 70 even though the ridge 62a is manufactured to be wide. Thus, a process of manufacturing the ridge is simple compared to the prior art. Moreover, it is possible to modulate the laser without changing threshold current required for laser oscillation. Problems such as the lack of stability and limited lifespan of the conventional semiconductor laser diode, may be solved by the present invention.

The second clad layer 62 is the same as the first clad layer 58 except that the second clad layer 62 is doped with p-type materials. The second compound semiconductor layer 64 is a GaN-based compound semiconductor layer of a III–V group, i.e., a nitride semiconductor layer and is preferably a direct transition type which is doped with p-type conductive impurities. Preferably, the second compound semiconductor layer 64 is a p-GaN layer, but may be an undoped GaN layer like the first compound semiconductor layer 52, or an AlGaN layer containing a predetermined amount of aluminium (Al) or an InGaN layer containing a predetermined amount of Indium (In).

Figure 4:
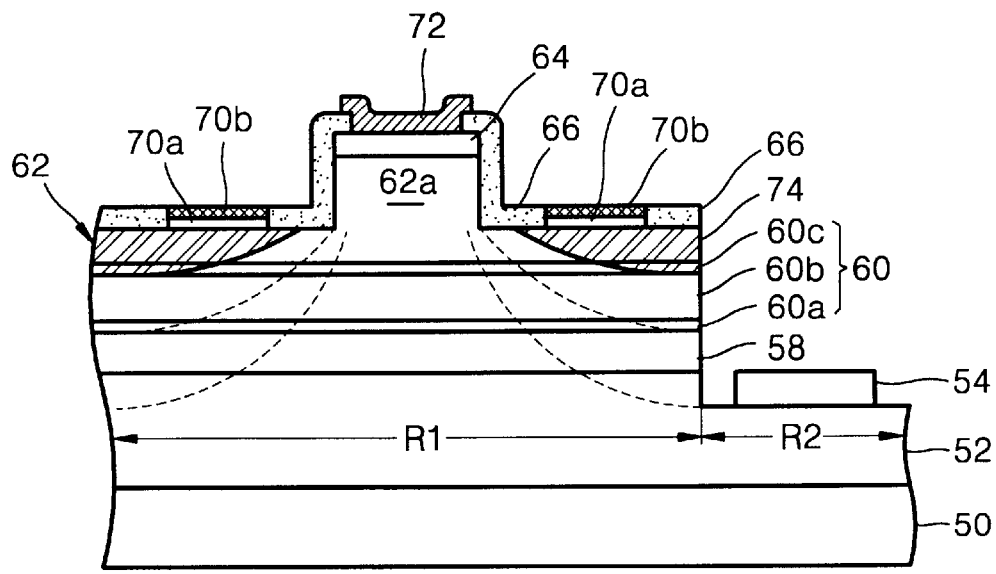
FIG. 4 is a cross-sectional view of a semiconductor laser diode having a carrier inflow width controller different from the carrier inflow width controller of the semiconductor laser diode shown in FIG. 3.

The first carrier inflow width controller 70 may have a metal oxide semiconductor (MOS) structure in which a dielectric layer is formed between a metallic layer and a semiconductor layer. In detail, as shown in FIG. 4, the first carrier inflow width controller 70 is a bilayer having a dielectric layer 70a and a metallic layer 70b which have a MOS structure if the second clad layer 62 underneath the dielectric layer 70a is included. It is not shown in detail, but the dielectric layer 70a does not contact the protective layer 66. The dielectric layer 70a may be extended broader than the metallic layer 70b under this condition. The dielectric layer 70a is a silicon oxide ($SiO_2$) layer or a silicon nitride ($Si_3N_4$) layer.

<Second embodiment>

A second embodiment is different from the first embodiment in the configuration of a carrier inflow width controller. In the first embodiment, the ridge 62a is used as the second carrier inflow width controller. Thus, in first embodiment there are first and second carrier inflow width controllers. However, in the second embodiment there is only one carrier inflow width controller.

Figure 5:
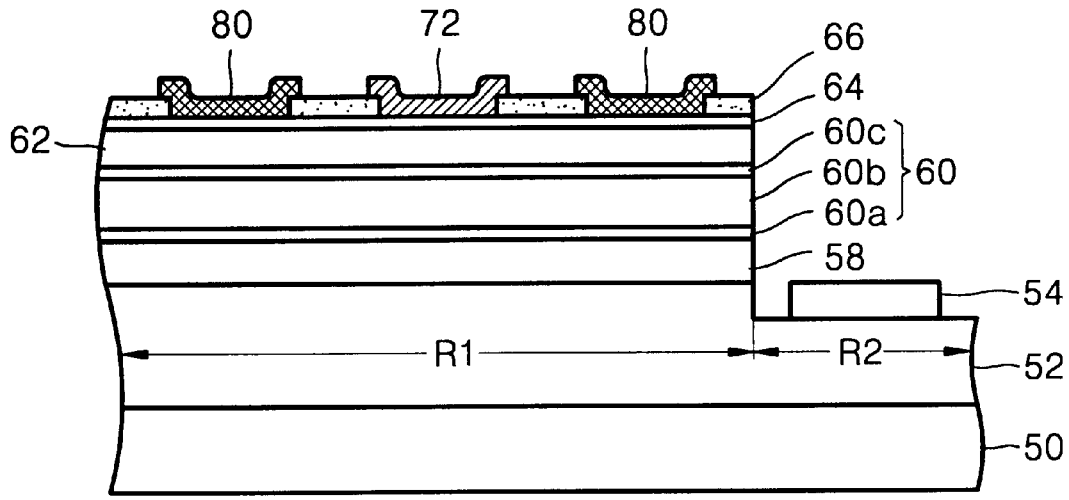
FIG. 5 is a cross-sectional view of a semiconductor laser diode which can control the width of a carrier inflow path according to a second embodiment of the present invention.

In detail, as shown in FIG. 5, a second clad layer 62 and a second compound semiconductor layer 64 are sequentially formed on a resonant layer 60. However, the second clad layer 62 does not include the ridge 62a of the first embodiment and the second compound semiconductor layer 64 is formed on the whole surface of the second clad layer 62, not just on a portion thereof. A second electrode 72 is formed on the second compound semiconductor layer 64 and a carrier inflow width controller 80 is symmetrically formed around the second electrode 72. The entire surface of the second semiconductor layer 64 exposed between the second electrode 72 and the carrier inflow width controller 80 is covered with a protective layer 66.

Figure 6:
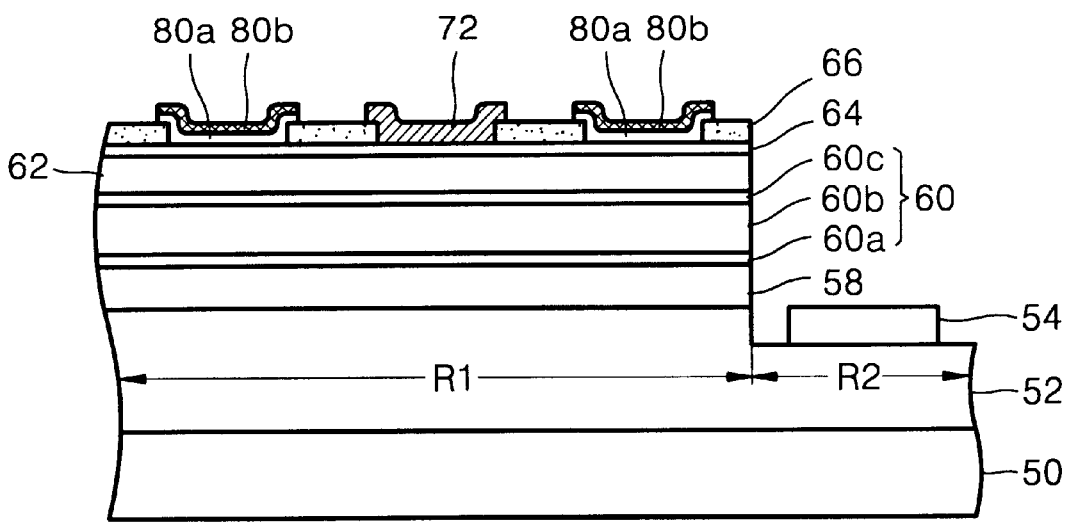
FIG. 6 is a cross-sectional view of a semiconductor laser diode having a carrier inflow width controller different from the carrier inflow width controller of the semiconductor laser diode shown in FIG. 5.

The carrier inflow width controller 80 is a bilayer having a dielectric layer 80a and a metallic layer 80b as shown in FIG. 6, and has a MOS structure if the second compound semiconductor layer 64 is included. The dielectric layer 80a is the same as the dielectric layer 70a in the first embodiment.

<Third embodiment>

In a third embodiment, a portion of a p-type electrode protrudes down toward an active layer, and a carrier inflow width controller covered with a dielectric layer is provided around the portion of the p-type electrode.

Figure 7:
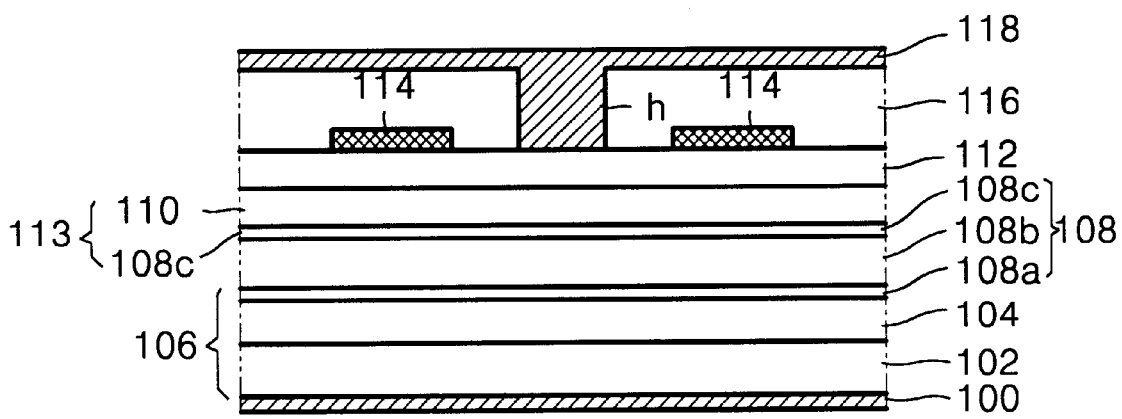
FIG. 7 is a cross-sectional view of a semiconductor laser diode which can control the width of a carrier inflow path according to a third embodiment of the present invention.

In detail, referring to FIG. 7, an n-type material layer 106 for lasing having an n-type compound semiconductor layer 102, an n-type clad layer 104, and an n-type waveguide layer 108a is formed on a first electrode 100. An active layer 108b is formed on the n-type material layer 106. The n-type waveguide layer 108a has a refractive index lower than the active layer 108b. A p-type material layer 113 for lasing having a p-type waveguide layer 108c, a p-type clad layer 110, and a p-type compound semiconductor layer 112 is formed on the active layer 108b. The p-type waveguide layer 108a has a refractive index lower than the active layer 108b. The n-type waveguide layer 108a of the n-type material layer 106, the p-type waveguide layer 108c of the p-type material layer 113, and the active layer 108b constitute a resonant layer 108. The above material layers are the same as those in the first embodiment.

Carrier inflow width controllers 114 are spaced apart from each other on the p-type material layer 113. Refer to the first embodiment for the detailed description of the carrier inflow width controllers 114. A dielectric layer 116 is formed on the p-type material layer 113 to cover the carrier inflow width controllers 114. The surface of the dielectric layer is planar. The dielectric layer 116 includes a contactor (not shown) for forming a schottky contact with the carrier inflow width controllers 114 and a via hole h exposing the p-type compound semiconductor layer 112. The via hole h is formed between the carrier inflow width controllers 114 without exposing the carrier inflow width controllers 114. A p-type electrode 118, which contacts the p-type compound semiconductor layer 112 via the via hole h, is formed on the dielectric layer 116. Thus, the p-type electrode 118 extends over the carrier inflow width controllers 114 and protrudes down toward the active layer 108b. The width of a path of carriers flowing from the p-type electrode 118 into the active layer 108b is limited by the via hole h. Thus, since a portion of the p-type electrode 118 filling the via hole h substantially limits the width of the path of carriers flowing from the p-type electrode 118 into the active layer 108b, it may be regarded as corresponding to the ridge 62a used as the second carrier inflow width controller in the first embodiment.

Figure 8:
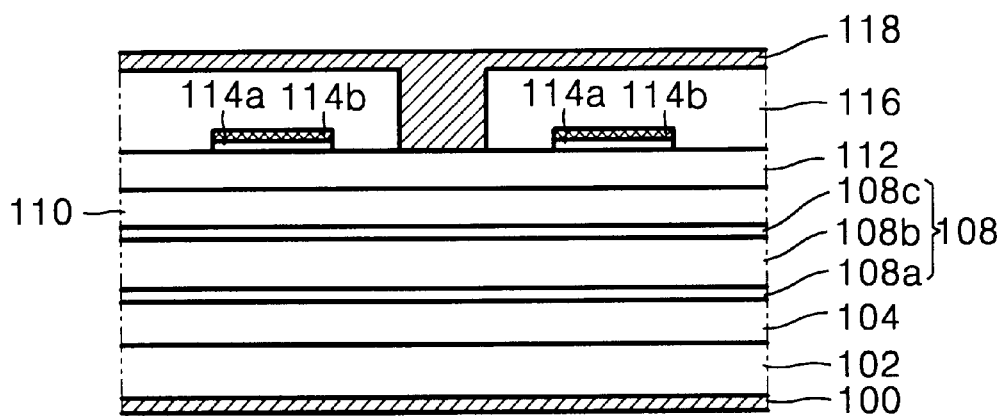
FIG. 8 is a cross-sectional view of a semiconductor laser diode having a carrier inflow width controller different from the carrier inflow width controller of the semiconductor laser diode shown in FIG. 7.

As shown in FIG. 8, the carrier inflow width controllers 114 may be bilayers sequentially having dielectric layers 114a and metallic layers 114b.

As described above, the semiconductor laser diode according to the present invention includes a carrier inflow width controller to control the width of a path of carriers flowing from a ridge into an active layer. Thus, even in a case where the physical width of the ridge is wide, an effective width of the ridge can be narrowed by controlling a reverse voltage applied to the carrier inflow width controller. As a result, it is possible to control modes of a laser closely related with the effective width of the ridge. Thus, even in the case where the physical width of the ridge is wide, the effective width of the ridge is controlled for the oscillation of a basic laser mode. Finally, a near field pattern near to an ideal shape is obtained. Thus, the difference between horizontal and vertical modes of the near field pattern is reduced to reduce distortion of the near field pattern. In addition, the diffusion of carriers in a horizontal direction when carriers pass through the ridge 62a is reduced, thereby reducing threshold current required for lasing. Also, the inflow path of carriers is completely blocked by increasing the reverse voltage applied to the carrier inflow width controller. Thus, rapid on/off switching can be realized. As described, it is easy to modulate the semiconductor laser diode without changing threshold current. Thus, the stability of the semiconductor laser diode can be ensured and the life of the semiconductor laser diode can be extended. As described above, the effective width of the ridge is controlled regardless of the physical width of the ridge. Thus, a process margin for the ridge is wide in a process of manufacturing the semiconductor laser diode. Therefore, a process of manufacturing the semiconductor laser diode is simple compared to the prior art and yield can be increased.

The preferred embodiments of the present invention described herein should not be construed as restricting the scope of the present invention. For example, one of ordinary skill in the art may apply the technical spirit of the invention to other types of semiconductor laser diodes required for limiting a carrier inflow width. The semiconductor laser diode according to the first embodiment may include a carrier inflow width controller only at one side of a ridge. Thus, the scope of the present invention must be determined by the appended claims, not by the above-described embodiments.

What is claimed is:

1. A semiconductor laser diode comprising:

a p-type electrode;

a p-type material layer in functional contact with said p-type electrode;

an active layer in functional contact with said p-type material layer;

an n-type material layer in functional contact with said active layer;

an n-type electrode in functional contact with said n-type material layer; and a carrier inflow channel width controller is located on the p-type material layer and not in contact the p-type electrode for controlling the width of a path of carriers flowing from the p-type electrode into the active layer, wherein said carrier inflow channel width controller includes a first carrier inflow channel width controller to which a bias is applied to control a width of a channel for electrically charged carriers entering said active region;

wherein said p-type material layer, said active layer and said n-type material layer are for lasing between the p-type electrode and the n-type electrode, and wherein the p-type electrode restrictively contacts the p-type material layer.

2. The semiconductor laser diode of claim 1, further comprising a second carrier inflow channel width controller between the p-type material layer and the p-type electrode.

3. The conductor laser diode of claim 1, wherein the p-type electrode extends over the first carrier inflow channel width controller with a dielectric layer interposed between the p-type electrode and the first carrier inflow channel width controller.

4. The semiconductor laser diode of claim 2, wherein said second carrier inflow channel width controller is a ridge in which a portion of the p-type material layer protrudes toward the p-type electrode.

5. The semiconductor laser diode of claim 2, wherein said second carrier inflow channel width controller is a portion of the p-type electrode which protrudes down toward the p-type material layer.

6. The semiconductor laser diode of claim 1, wherein the first carrier inflow channel width controller is a metallic pad layer using a Schottky contact characteristic according to which a reverse voltage is applied when a voltage for lasing is applied.

7. The semiconductor laser diode of claim 2, wherein the first carrier inflow channel width controller is a metallic pad layer using a Schottky contact characteristic according to which a reverse voltage is applied when a voltage for lasing is applied.

8. The semiconductor laser diode of claim 3, wherein the first carrier inflow channel width controller is a metallic pad layer using a Schottky contact characteristic according to which a reverse voltage is applied when a voltage for lasing is applied.

9. The semiconductor laser diode of claim 8, further comprising a dielectric layer between the metallic pad layer and the p-type material layer.

10. The semiconductor laser diode of claim 1, wherein the first carrier inflow channel width controller is located symmetrically around said p-type electrode.

* * * * *